United States Patent
Kuwada

(10) Patent No.: US 12,406,835 B2
(45) Date of Patent: Sep. 2, 2025

(54) TEMPERATURE CONTROLLER, SUBSTRATE PROCESSING APPARATUS, AND PRESSURE CONTROL METHOD

(71) Applicant: TOKYO ELECTRON LIMITED, Tokyo (JP)

(72) Inventor: Tomonao Kuwada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 685 days.

(21) Appl. No.: 17/704,844

(22) Filed: Mar. 25, 2022

(65) Prior Publication Data

US 2022/0310368 A1    Sep. 29, 2022

(30) Foreign Application Priority Data

Mar. 26, 2021  (JP) .................................. 2021-053733

(51) Int. Cl.
  *H01J 37/32* (2006.01)
  *G05D 16/20* (2006.01)
  *G05D 23/19* (2006.01)

(52) U.S. Cl.
  CPC .... *H01J 37/32724* (2013.01); *G05D 16/2066* (2013.01); *G05D 23/1917* (2013.01)

(58) Field of Classification Search
  CPC .............. C23C 16/4583; C23C 16/463; G05D 16/2066; G05D 23/1917; G05D 23/1919; H01J 37/32724; H01L 21/67109; H01L 21/67248
  See application file for complete search history.

(56) References Cited

U.S. PATENT DOCUMENTS

| | | | | |
|---|---|---|---|---|
| 2002/0048311 A1* | 4/2002 | Norrbakhsh | ...... | H01L 21/67248 374/161 |
| 2007/0074865 A1* | 4/2007 | Ichinose | .............. | G05D 7/0635 165/247 |
| 2012/0016508 A1* | 1/2012 | Matsuzaki | ........ | H01J 37/32623 700/108 |
| 2015/0176928 A1* | 6/2015 | Tabuchi | ............. | G05D 23/1951 165/96 |
| 2019/0355598 A1 | 11/2019 | Kataoka | | |
| 2020/0051839 A1 | 2/2020 | Criminale et al. | | |

FOREIGN PATENT DOCUMENTS

JP     2014-021828 A    2/2014

\* cited by examiner

*Primary Examiner* — Benjamin Kendall
(74) *Attorney, Agent, or Firm* — XSENSUS LLP

(57) ABSTRACT

A temperature controller includes a supply line configured to supply a heat medium to at least one control target, a return line configured to return the heat medium from control target, a pump configured to discharge the heat medium to the supply line, a pressure sensor configured to detect a pressure in the supply line disposed immediately after the pump, and a controller. The controller is configured to control the temperature controller to control a discharge pressure of the pump based on a difference between the pressure detected by the pressure sensor and a set value of the discharge pressure of the pump.

13 Claims, 8 Drawing Sheets

TEMPERATURE CONTROLLER, SUBSTRATE PROCESSING APPARATUS, AND PRESSURE CONTROL METHOD

CROSS-REFERENCE TO RELATED APPLICATIONS

This application claims priority to Japanese Patent Application No. 2021-053733 filed on Mar. 26, 2021, the entire contents of which are incorporated herein by reference.

TECHNICAL FIELD

The present disclosure relates to a temperature controller, a substrate processing apparatus, and a pressure control method.

BACKGROUND

In a substrate processing apparatus, temperature control is performed by circulating brine that is a heat medium through a flow path in a substrate support using a pump. For example, it is proposed to vaporize a temperature control medium in a cavity in a substrate support to control a pressure in the cavity to a target pressure (see U.S. Patent Application Publication No. 2012/0016508). Further, it is proposed to prepare a reference table for a relationship between a wafer temperature and a coolant pressure in advance and control the coolant pressure based on wafer temperature drift using the reference table at the time of measurement (see U.S. Patent Application Publication No. 2002/0048311). Further, it is proposed to control a flow rate of a coolant in a pump or a temperature control system including a high temperature fluid source, a low temperature fluid source, and a three-way valve using an operating frequency of an inverter (see U.S. Patent Application Publication No. 2020/0051839 and No. 2019/0355598).

SUMMARY

The present disclosure provides a temperature controller, a substrate processing apparatus, and a pressure control method capable of improving temperature controllability for a control target.

One aspect of the present disclosure provides a temperature controller includes a supply line configured to supply a heat medium to at least one control target, a return line configured to return the heat medium from control target, a pump configured to discharge the heat medium to the supply line, a pressure sensor configured to detect a pressure in the supply line disposed immediately after the pump, and a controller, wherein the controller is configured to control the temperature controller to control a discharge pressure of the pump based on a difference between the pressure detected by the pressure sensor and a set value of the discharge pressure of the pump.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of a temperature controller, a substrate processing apparatus, and a temperature control method of the present disclosure will be described in detail with reference to the accompanying drawings. The following embodiments are not intended to limit the present disclosure.

In circulation of a heat medium, for example, a flow rate of a heat medium on a high temperature side and a flow rate of a heat medium on a low temperature side may be switched for a substrate support as a temperature control target, or the number of substrate processing apparatuses as a temperature control target may increase or decrease. In that case, a pressure in a line through which the heat medium is supplied varies considerably due to interference between valves, or the like, so that circulation controllability deteriorates. Accordingly, an operation of a pump becomes unstable, which may deteriorate temperature controllability for the temperature control target. In the case of performing flow rate feedback control or performing control while fixing an inverter frequency of the pump for circulation control of the pump, it is difficult to suppress deterioration of circulation controllability. Further, in the case of switching a line on a return side using a check valve, a valve on a high temperature side and a valve on a low temperature side may be opened at the same time without controlling a pressure difference, which may also result in deterioration of the temperature controllability. In this case, alarm stop occurs due to an insufficient liquid amount or an excessive liquid amount caused by deviation of a liquid level of a tank on a high temperature side and a liquid level of a tank on a low temperature side, or the temperature controllability deteriorates due to excessive heat loss caused by liquid movement through a communication line between the tank on the high temperature side and the tank on the low temperature side. Hence, it is expected to improve the temperature controllability for the control target by controlling a pressure on a discharge side of the pump to be constant.

(Configuration of Substrate Processing Apparatus 1)

Figure 1:
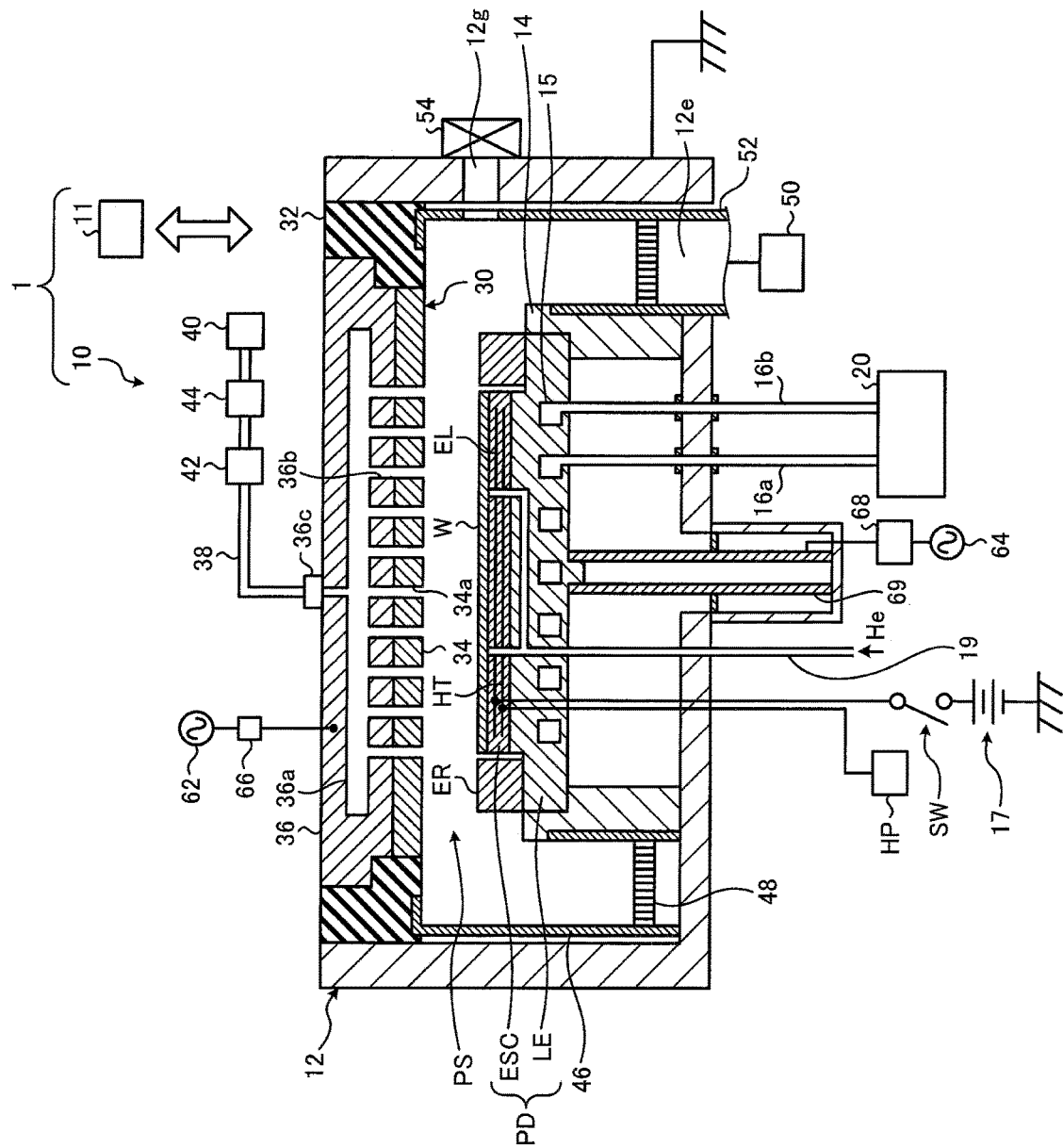
FIG. 1 is a schematic cross-sectional view showing an example of a substrate processing apparatus according to an embodiment of the present disclosure.

FIG. 1 is a schematic cross-sectional view showing an example of a substrate processing apparatus according to an embodiment of the present disclosure. The substrate processing apparatus 1 is, e.g., a plasma etching apparatus including parallel plate electrodes. The substrate processing apparatus 1 includes an apparatus main body 10 and a controller 11. The apparatus main body 10 has a processing chamber 12 made of a material such as aluminum or the like and formed in a substantially cylindrical shape, for example. The processing chamber 12 has an anodically oxidized inner wall surface. Further, the processing chamber 12 is frame grounded.

A substantially cylindrical support portion 14 made of an insulating material such as quartz or the like is disposed at a bottom portion of the processing chamber 12. In the processing chamber 12, the support portion 14 extends vertically (e.g., toward an upper electrode 30) from the bottom portion of the processing chamber 12.

A substrate support PD is disposed in the processing chamber 12. The substrate support PD is supported by the support portion 14. The substrate support PD holds a wafer W on an upper surface thereof. The wafer W is an example of a temperature control target. The substrate support PD has an electrostatic chuck ESC and a lower electrode LE. The lower electrode LE is made of a metal material such as aluminum or the like and has a substantially disc shape. The electrostatic chuck ESC is disposed on the lower electrode LE. The lower electrode LE is an example of a heat exchange member for exchanging heat with the temperature control target.

The electrostatic chuck ESC has a structure in which an electrode EL that is a conductive film is embedded between two insulating layers or between two insulating sheets. A DC power supply 17 is electrically connected to the electrode EL through a switch SW. The electrostatic chuck ESC attracts the wafer W on the upper surface thereof by an electrostatic force such as a Coulomb force generated by a DC voltage supplied from the DC power supply 17. Accordingly, the electrostatic chuck ESC can hold the wafer W.

A heat transfer gas such as He gas or the like is supplied to the electrostatic chuck ESC through a line 19. The heat transfer gas supplied through the line 19 is supplied to a gap between the electrostatic chuck ESC and the wafer W. By adjusting a pressure of the heat transfer gas supplied to the gap between the electrostatic chuck ESC and the wafer W, thermal conductivity between the electrostatic chuck ESC and the wafer W can be adjusted.

Further, a heater HT that is a heating element is disposed in the electrostatic chuck ESC. A heater power supply HP is connected to the heater HT. By supplying a power from the heater power supply HP to the heater HT, the wafer W on the electrostatic chuck ESC can be heated through the electrostatic chuck ESC. A temperature of the wafer W placed on the electrostatic chuck ESC is adjusted by the lower electrode LE and the heater HT. The heater HT may be disposed between the electrostatic chuck ESC and the lower electrode LE.

An edge ring ER is disposed around the electrostatic chuck ESC to surround an edge of the wafer W and the electrostatic chuck ESC. The edge ring ER may also be referred to as "focus ring." The edge ring ER can improve in-plane uniformity of processing on the wafer W. The edge ring ER is made of a material that is appropriately selected depending on a material of a film to be etched, such as quartz or the like.

A flow path 15 through which a heat medium that is an insulating fluid such as Galden (Registered Trademark) or the like flows is formed in the lower electrode LE. The heat medium may also be referred to as "brine." A temperature controller 20 is connected to the flow path 15 through lines 16a and 16b. The temperature controller 20 controls a temperature of the heat medium flowing in the flow path 15 of the lower electrode LE. The heat medium whose temperature is controlled by the temperature controller 20 is supplied into the flow path 15 of the lower electrode LE through the line 16a. The heat medium flowing in the flow path 15 is returned to the temperature controller 20 through the line 16b.

The temperature controller 20 circulates the heat medium flowing in the flow path 15 of the lower electrode LE. Further, the temperature controller 20 mixes a heat medium having a first temperature or a heat medium having a second temperature with the circulating heat medium and supplies the mixed heat medium into the flow path 15 of the lower electrode LE. The temperature of the lower electrode LE is controlled to a set temperature by supplying the mixture of the heat medium having the first temperature or the heat medium having the second temperature with the circulating heat medium into the flow path 15 of the lower electrode LE. The first temperature is, e.g., a temperature of room temperature or higher, and the second temperature is, e.g., a temperature of 0° C. or lower. Hereinafter, the heat medium having the first temperature will be referred to as "first heat medium" and the heat medium having the second temperature will be referred to as "second heat medium." The first heat medium and the second heat medium are fluids made of the same material and having different temperatures. The temperature controller 20 and the controller 11 are examples of a heat medium controller.

A power supply line 69 for supplying a radio frequency (RF) power to the lower electrode LE is electrically connected to a bottom surface of the lower electrode LE. The power supply line 69 is made of a metal. Although it is not illustrated in FIG. 1, lifter pins for transferring the wafer W on the electrostatic chuck ESC, a driving mechanism thereof, and the like are disposed in the space between the lower electrode LE and the bottom portion of the processing chamber 12.

A first RF power supply 64 is connected to the power supply line 69 through a matching device 68. The first RF power supply 64 generates an RF power for attracting ions into the wafer W, i.e., an RF bias power, having a frequency of 400 kHz to 40.68 MHz, e.g., 13.56 MHz. The matching device 68 is a circuit for matching an output impedance of the first RF power supply 64 with an input impedance on a load (lower electrode LE) side. The RF bias power generated by the first RF power supply 64 is supplied to the lower electrode LE through the matching device 68 and the power supply line 69.

The upper electrode 30 is disposed above the substrate support PD to face the substrate support PD. The lower electrode LE and the upper electrode 30 are substantially parallel to each other. Plasma is generated in a space between the upper electrode 30 and the lower electrode LE, and plasma processing such as etching or the like is performed on the wafer W held on the upper surface of the electrostatic chuck ESC by the generated plasma. The space between the upper electrode 30 and the lower electrode LE serves as a processing space PS.

The upper electrode 30 is supported at an upper portion of the processing chamber 12 via an insulating shielding member 32 made of, e.g., quartz or the like. The upper electrode 30 has an electrode plate 34 and an electrode support 36. A bottom surface of the electrode plate 34 faces the processing space PS. A plurality of gas injection holes 34a are formed in the electrode plate 34. The electrode plate 34 is made of a material containing silicon, for example.

The electrode support 36 is made of a conductive material such as aluminum or the like, and detachably supports the electrode plate 34 from the top. The electrode support 36 may have a water-cooling structure (not shown). A diffusion space 36a is formed in the electrode support 36. A plurality of gas holes 36b communicating with the gas injection holes 34a of the electrode plate 34 extend downward (toward the substrate support PD) from the diffusion space 36a. The electrode support 36 is provided with a gas inlet port 36c for introducing a processing gas into the diffusion space 36a, and a line 38 is connected to the gas inlet port 36c.

A gas source group 40 is connected to the line 38 through a valve group 42 and a flow rate controller group 44. The gas source group 40 has a plurality of gas sources. The valve group 42 includes a plurality of valves, and the flow rate controller group 44 includes a plurality of flow rate controllers such as a mass flow controller and the like. Each of the gas sources in the gas source groups 40 is connected to the line 38 through the corresponding valve in the valve group 42 and the corresponding flow rate controller in the flow rate controller group 44.

Accordingly, the apparatus main body 10 can supply a processing gas from one or multiple gas sources selected from the gas source group 40 to the diffusion space 36a in the electrode support 36 at an individually controlled flow rate. The processing gas supplied to the diffusion space 36a is diffused in the diffusion space 36a and supplied in a shower pattern into the processing space PS through the gas holes 36b and the gas injection holes 34a.

A second RF power supply 62 is connected to the electrode support 36 through a matching device 66. The second RF power supply 62 generates an RF power for plasma generation having a frequency of 27 MHz to 100 MHz, e.g., 60 MHz. The matching device 66 is a circuit for matching an output impedance of the second RF power supply 62 with the input impedance on the load (upper electrode 30) side. The RF power generated by the second RF power supply 62 is supplied to the upper electrode 30 through the matching device 66. The second RF power supply 62 may be connected to the lower electrode LE through the matching device 66.

A deposition shield 46 whose surface is made of aluminum coated with $Y_2O_3$, quartz, or the like is detachably attached to an inner wall surface of the processing chamber 12 and an outer surface of the support portion 14. The deposition shield 46 can prevent etching by-products (deposits) from being adhered to the processing chamber 12 and the support portion 14.

Between an outer wall of the support portion 14 and an inner sidewall of the treatment chamber 12, an exhaust plate 48 made of aluminum coated with $Y_2O_3$, quartz, or the like is disposed on the bottom side (where the support portion 14 is disposed) of the processing chamber 12. An exhaust port 12e is disposed below the exhaust plate 48. An exhaust device 50 is connected to the exhaust port 12e through an exhaust line 52.

The exhaust device 50 has a vacuum pump such as a turbo molecular pump or the like, and can reduce a pressure in an inner space of the processing chamber 12 to a desired vacuum level. An opening 12g for loading/unloading the wafer W is disposed on a sidewall of the processing chamber 12. The opening 12g can be opened and closed by a gate valve 54.

A controller 11 has a processor, a memory, and an input/output interface. The memory stores a program executed by the processor and a recipe including conditions for each processing. The processor executes the program read from the memory, and controls individual components of the apparatus main body 10 through the input/output interface based on the recipe stored in the memory to perform predetermined processing such as etching or the like on the wafer W. The controller 11 is an example of a control device.

(Configuration of Temperature Controller 20)

Figure 2:
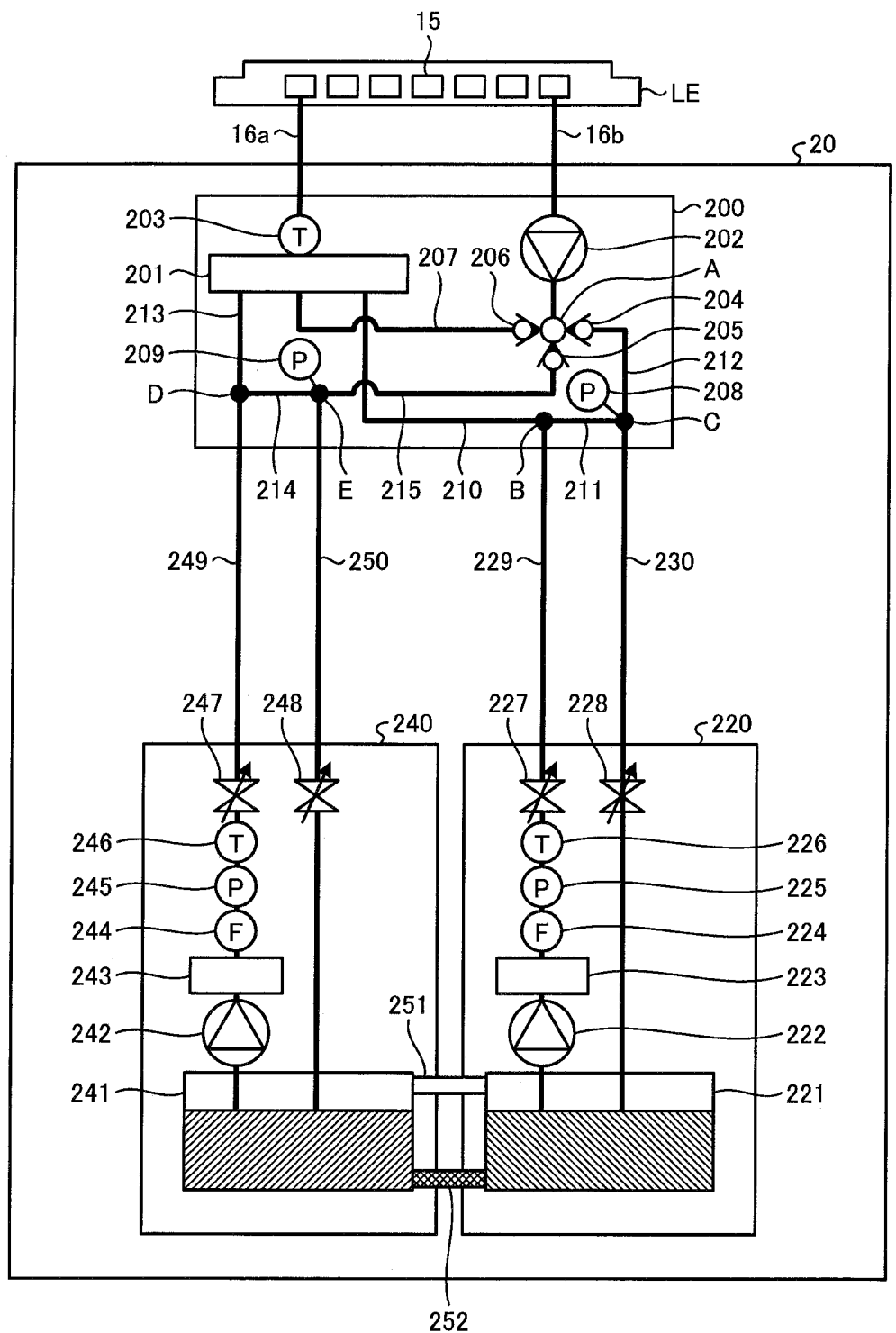
FIG. 2 shows an example of a temperature controller according to the embodiment.

FIG. 2 shows an example of a temperature controller according to the present embodiment. The temperature controller 20 includes a circulator 200, a first temperature controller 220, and a second temperature controller 240. For example, the circulator 200 is installed on the same level as the level where the processing chamber 12 is installed, and the first temperature controller 220 and the second temperature controller 240 are installed on a level lower than the level where the circulator 200 is installed.

In the circulator 200, an outlet side of a valve 201 is connected to the line 16a. Further, in the circulator 200, a pump 202 for circulating a heat medium flowing in the flow path 15 of the lower electrode LE is connected to the line 16b. The line 16b on the outlet side of the pump 202 is connected to an inlet side of the valve 201 through a check valve 206 and a line 207 at a connection position A. Since a pressure of the line 207 is lower than a pressure of the line 16b on the outlet side of the pump 202 during an operation of the pump 202, the check valve 206 is opened. Therefore, the heat medium circulates in the order of the pump 202, the line 16b, the check valve 206, the line 207, the valve 201, the line 16a, the flow path 15, and the line 16b. The line 207 is an example of a third line. Further, the line 16a in the circulator 200 is provided with a temperature sensor 203 for detecting a temperature on the inlet side of the flow path 15. The temperature sensor 203 may be disposed outside the temperature controller 20. For example, the temperature sensor 203 may be disposed directly below the lower electrode LE, e.g., at the connection portion between the line 16a and the flow path 15, or may be disposed at an intermediate portion between the lower electrode LE and the temperature controller 20.

The first temperature controller 220 is connected to the line 16a through a line 229, a line 210, and the valve 201. Further, the first temperature controller 220 is connected to the line 16b through a line 230, a line 212, and the check valve 204. A connection position B between the line 229 and the line 210 and a connection position C between the line 230 and the line 212 are connected by a line 211 that is a bypass line. A pressure sensor 208 for monitoring is disposed at the connection position C.

In the present embodiment, the first temperature controller 220 controls a temperature of the first heat medium on a high temperature side. The temperature-controlled first heat medium of the first temperature controller 220 passes through the line 229, the line 210, and the valve 201 and is mixed with the heat medium circulating from the line 207 to the line 16a, and the mixed heat medium is supplied into the flow path 15 of the lower electrode LE. The temperature of the first heat medium may be, e.g., 90° C. The pressures in the lines 210 to 212, 229, and 230 are reduced by supplying the first heat medium into the flow path 15 of the lower electrode LE. The heat medium discharged from the flow path 15 passes through the check valve 204 that is opened due to a partial pressure drop at the connection position A of the line 16b, and is returned to the temperature controller 220 through the lines 212 and 230. The line including the lines 229, 210, and 16a is an example of a supply line or a first supply line. The line including the lines 16b, 212, and 230 is an example of a return line or a first return line. The line including the lines 210 to 212, 229, and 230 is an example of a first line.

The first temperature controller 220 supplies a heat medium in a reservoir tank 221 to the line 229 using a pump 222. A heat exchanger 223, a flow rate sensor 224, a pressure sensor 225, a temperature sensor 226, and a variable valve 227 are disposed on the outlet side of the pump 222. In other words, the heat exchanger 223, the flow sensor 224, the pressure sensor 225, the temperature sensor 226, and the variable valve 227 are disposed immediately after the pump 222. The heat exchanger 223 heats or cools the heat medium supplied to the line 229 to a set temperature. The flow rate sensor 224 detects a flow rate of the heat medium supplied by the pump 222 on a discharge side of the line 229. The pressure sensor 225 detects a pressure of the heat medium supplied by the pump 222 on the discharge side of the line 229. The temperature sensor 226 detects a temperature of the heat medium supplied by the pump 222 on the discharge side of the line 229. The variable valve 227 adjusts a pressure of the heat medium supplied by the pump 222 in the line 229 together with a variable valve 228 on the line 230 side that is the return line.

The second temperature controller 240 is connected to the line 16a through a line 249, a line 213, and the valve 201. Further, the second temperature controller 240 is connected to the line 16b through a line 250, a line 215, and a check valve 205. A connection position D between the line 249 and the line 213 and a connection position E between the line 250 and the line 215 are connected by a line 214 that is a bypass line. A pressure sensor 209 for monitoring is disposed at the connection position E.

In the present embodiment, the second temperature controller 240 controls a temperature of the second heat medium on a low temperature side. The temperature-controlled second heat medium of the second temperature controller 240 passes through the line 249, the line 213, and the valve 201 and is mixed with the heat medium circulating from the line 207 to the line 16a, and the mixed heat medium is supplied into the flow path 15 of the lower electrode LE. The temperature of the second heat medium may be, e.g., −10° C. The pressures in the lines 213 to 215, 249, and 250 are reduced by supplying the second heat medium into the flow path 15 of the lower electrode LE. The heat medium discharged from the flow path 15 passes through the check valve 205 that is opened due to a partial pressure drop at the connection position A of the line 16b, and is returned to the temperature controller 240 through the lines 215 and 250. The line including the lines 249, 213, and 16a is an example of a supply line or a second supply line. The line including the lines 16b, 215, and 250 is an example of a return line or a second return line. The line including the lines 213 to 215, 249, and 250 is an example of a second line. The check valve (a first check valve) 204, the check valve (a second check valve) 205 and the check valve (a third check valve) 206 constitute a check valve mechanism. The check valve mechanism is connected to the outlet of the flow path 15 and configured to branch the heat medium in three directions.

The second temperature controller 240 supplies a heat medium in a reservoir tank 241 to the line 249 using a pump 242. A heat exchanger 243, a flow sensor 244, a pressure sensor 245, a temperature sensor 246, and a variable valve 247 are disposed on the outlet side of the pump 242. In other words, the heat exchanger 243, the flow sensor 244, the pressure sensor 245, the temperature sensor 246, and the variable valve 247 are disposed immediately after the pump 242. The heat exchanger 243 heats or cools the heat medium supplied to the line 249 to a set temperature. The flow rate sensor 244 detects a flow rate of the heat medium supplied by the pump 242 on the discharge side of the line 249. The pressure sensor 245 detects a pressure of the heat medium supplied by the pump 242 on the discharge side of the line 249. The temperature sensor 246 detects a temperature of the heat medium supplied by the pump 242 on the discharge side of the line 249. The variable valve 247 adjusts a pressure of the heat medium supplied by the pump 242 in the line 249 together with a variable valve 248 on the line 250 side that is the return line.

The reservoir tank 221 of the first temperature controller 220 and the reservoir tank 241 of the second temperature controller 240 are connected by lines 251 and 252. The lines 251 and 252 are examples of a communication line, and adjust a liquid level of the reservoir tank 221 storing the first heat medium and a liquid level of the reservoir tank 241 storing the second heat medium. The line 251 is used for movement of a gas (air, evaporated heat medium, or the like) between the reservoir tanks 221 and 241. The line 252 is used for movement of a liquid (heat medium) between the reservoir tanks 221 and 241. Accordingly, leakage of the heat medium is prevented.

The controller 11 controls opening degrees of the valves 201, 227, 228, 247, and 248, discharge pressures of the pumps 202, 222, and 242, and temperatures in the heat exchangers 223 and 243. The pumps 202, 222, and 242 can control the discharge pressure depending on an inverter frequency. The opening degree of the valve 201 can be adjusted within a range of +100% and −100%, for example. At a position where the opening degree of the valve 201 is 0%, the entire heat medium from the line 207 flows into the line 16a, and the heat media from the lines 210 and 213 do not flow into the line 16a. At a position where the opening degree of the valve 201 is +100%, the entire heat medium from the line 210 flows into the line 16a, and the heat media from the lines 207 and 213 do not flow into the line 16a. On the other hand, at a position where the opening degree of the valve 201 is −100%, the entire heat medium from the line 213 flows into the line 16a, and the heat media from the lines 207 and 210 do not flow into the line 16a.

In other words, when it is desired to increase the temperature of the circulating heat medium obtained by adding the first heat medium on the high temperature side thereto, the opening degree of the valve 201 is changed from the 0% position to a plus side. On the other hand, when it is desired to decrease the temperature of the circulating heat medium obtained by adding the second heat medium on the low temperature side thereto, the opening degree of the valve 201 is changed from the 0% position to a minus side. For example, when plasma is ignited in the processing space PS to perform plasma processing, heat is inputted from the plasma to the lower electrode LE. Therefore, in order to keep the temperature of the lower electrode LE at a constant level, the second heat medium on the low temperature side of the line 213 is added thereto at a ratio of 10% by setting the opening degree of the valve 201 to −10% and setting the flow rate of the heat medium circulating in the line 207 to 90%, for example.

(Pressure Control Method)

Figure 3:
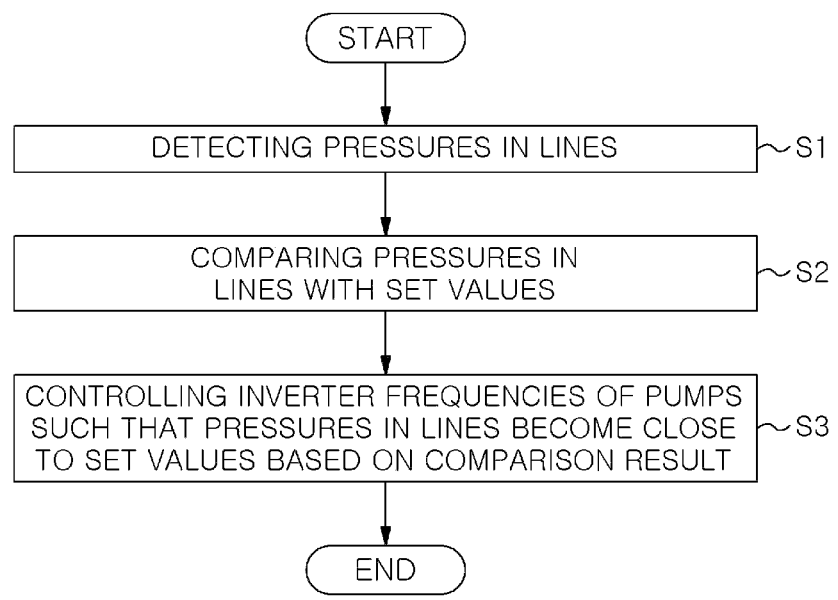
FIG. 3 is a flowchart showing an example of a pressure control process according to the embodiment.

Next, a pressure control method according to the present embodiment will be described. FIG. 3 is a flowchart showing an example of a pressure control process in the present embodiment.

The controller 11 operates the pump 202 of the circulator 200 to start the circulation of the heat medium in the order of the line 16b, the check valve 206, the line 207, the valve 201, the line 16a, the flow path 15, and the line 16b. The controller 11 controls the opening degree of the valve 201 based on the temperature detected by the temperature sensor 203, and controls the temperature of the circulating heat medium to the set temperature.

The controller 11 controls the pressure sensors 225 and 245 to detect the pressures in the lines 229 and 249, respectively (step S1). The controller 11 compares the detected pressures in the lines 229 and 249 with set values (step S2). The controller 11 controls inverter frequencies of the pumps 222 and 242 such that the pressures in the lines 229 and 249 become close to the set values based on the comparison result (step S3). In other words, the controller 11 controls the discharge pressures of the pump 222 and 242 based on the difference between the pressures detected by the pressure sensors 225 and 245 and the set values of the discharge pressures of the pump 222 and 242. Accordingly, it is possible to improve the temperature controllability for the control target (the lower electrode LE).

(Operation of Temperature Controller 20)

Next, an operation of the temperature controller 20 in the case where the temperature detected by the temperature sensor 203 is lower than 35° C. that is the set temperature of the circulating heat medium, i.e., the set temperature of the lower electrode LE as a control target, and an operation of the temperature controller 20 in the case where the temperature detected by the temperature sensor 203 is higher than 35° C. will be described. In the following description, the first set value of the pressure in the line 229 in the first temperature controller 220 and the second set value of the pressure in the line 249 in the second temperature controller 240 on the low temperature side, i.e., the set values of the discharge pressures of the pumps 222 and 242, are set to 0.7 MPa to 1.0 MPa. Further, the check valve 204 connected to the line 212 on the high temperature side is adjusted to be opened at 0.580 MPa to 0.590 MPa, and the check valve 205 connected to the line 215 on the low temperature side is adjusted to be opened at 0.570 to MPa 0.580 MPa. In other words, the pressure difference between the high temperature side and the low temperature side is set to 0.010 MPa (high temperature side>low temperature side). The above-described set values of the pressures are examples, and the set values of the pressures are not limited thereto.

First, when the temperature detected by the temperature sensor 203 is lower than the set temperature, the controller 11 changes the opening degree of the valve 201 from the current position to the plus side so that the first heat medium from the line 210 flows into the line 16a. When the first heat medium from the line 210 flows into the line 16a, the pressure in the line 210 is reduced, and the pressures in the lines 211, 212, 229, and 230 connected to the line 210 are also reduced. In other words, the pressures detected by the pressure sensors 208 and 225 are reduced.

Before the opening degree of the valve 201 is changed, the second heat medium on the low temperature side flows into the line 16a. In this case, if the position of the opening degree of the valve 201 is changed to the plus side, the line 213 side of the valve 201 is closed, so that the pressure in the line 215 on the low temperature side increases and the check valve 205 connected to the line 215 is changed from the open state to the closed state. On the other hand, on the high temperature side, the pressure in the line 212 is reduced, so that the check valve 204 is opened and the heat medium corresponding to the inflow amount flows from the line 16b to the line 212.

The controller 11 compares the pressure in the line 229 detected by the pressure sensor 225 with the first set value, and increases the discharge pressure by controlling the inverter frequency of the pump 222 such that the reduced pressure in the line 229 becomes close to the set value. In other words, feedback control is performed based on the pressure in the line 229.

When the discharge pressure of the pump 222 increases, the pressure in the line 229 increases and the pressures in the lines 210 to 212 and 230 connected to the line 229 also increase. When the temperature detected by the temperature sensor 203 reaches the set temperature, the controller 11 changes the opening degree of the valve 201 from the current position to the minus side. When the opening of the valve 201 is changed from the current position to the minus side, the pressure in the line 210 increases and the pressures in the lines 211, 212, 229, and 230 connected to the line 210 also increase. Accordingly, the check valve 204 is closed.

Next, when the temperature detected by the temperature sensor 203 is higher than the set temperature, the controller 11 changes the opening degree of the valve 201 from the current position to the minus side so that the second heat medium from the line 213 flows into the line 16a. When the second heat medium from the line 213 flows into the line 16a, the pressure in the line 213 is reduced and the pressures in the lines 214, 215, 249, and 250 connected to the line 213 are also reduced. In other words, the pressures detected by the pressure sensors 209 and 245 are reduced.

Before the opening degree of the valve 201 is changed, the first heat medium on the high temperature side flows into the line 16a. In this case, if the position of the opening degree of the valve 201 is changed to the minus side, the line 210 side of the valve 201 is closed, so that the pressure in the line 212 on the high temperature side increases and the check valve 204 connected to the line 212 is changed from an open state to a closed state. On the other hand, on the low temperature side, the pressure in the line 215 is reduced, so that the check valve 205 is opened and a heat medium corresponding to the inflow amount flows from the line 16b to the line 215.

The controller 11 compares the pressure in the line 249 detected by the pressure sensor 245 with the second set value, and increases the discharge pressure by controlling the inverter frequency of the pump 242 such that the reduced pressure in the line 249 becomes close to the set value. In other words, the feedback control is performed based on the pressure in the line 249.

When the discharge pressure of the pump 242 increases, the pressure in the line 249 increases and the pressures in the lines 213 to 215, and 250 connected to the line 249 also increase. When the temperature detected by the temperature sensor 203 reaches the set temperature, the controller 11 changes the opening degree of the valve 201 from the current position to the plus side. When the opening of the valve 201 is changed from the current position to the plus side, the pressure in the line 213 increases and the pressures in the lines 214, 215, 249, and 250 connected to the line 213 also increase, so that the check valve 205 is closed. In this manner, the time in which the check valves 204 and 205 are opened simultaneously can be shortened, which makes it possible to improve the temperature controllability for the control target (the lower electrode LE). In other words, since the pressure feedback control is performed depending on the pressure difference between the check valves 204 and 205, the responsiveness is improved and the pressure variation can be suppressed. The temperature controller 20 may include a control device for performing control based on information from the controller 11. In this case, the feedback control may be performed based on the pressures detected by the pressure sensors 208 and 209 instead of the pressures detected by the pressure sensors 225 and 245.

(Test Results)

Figure 4:
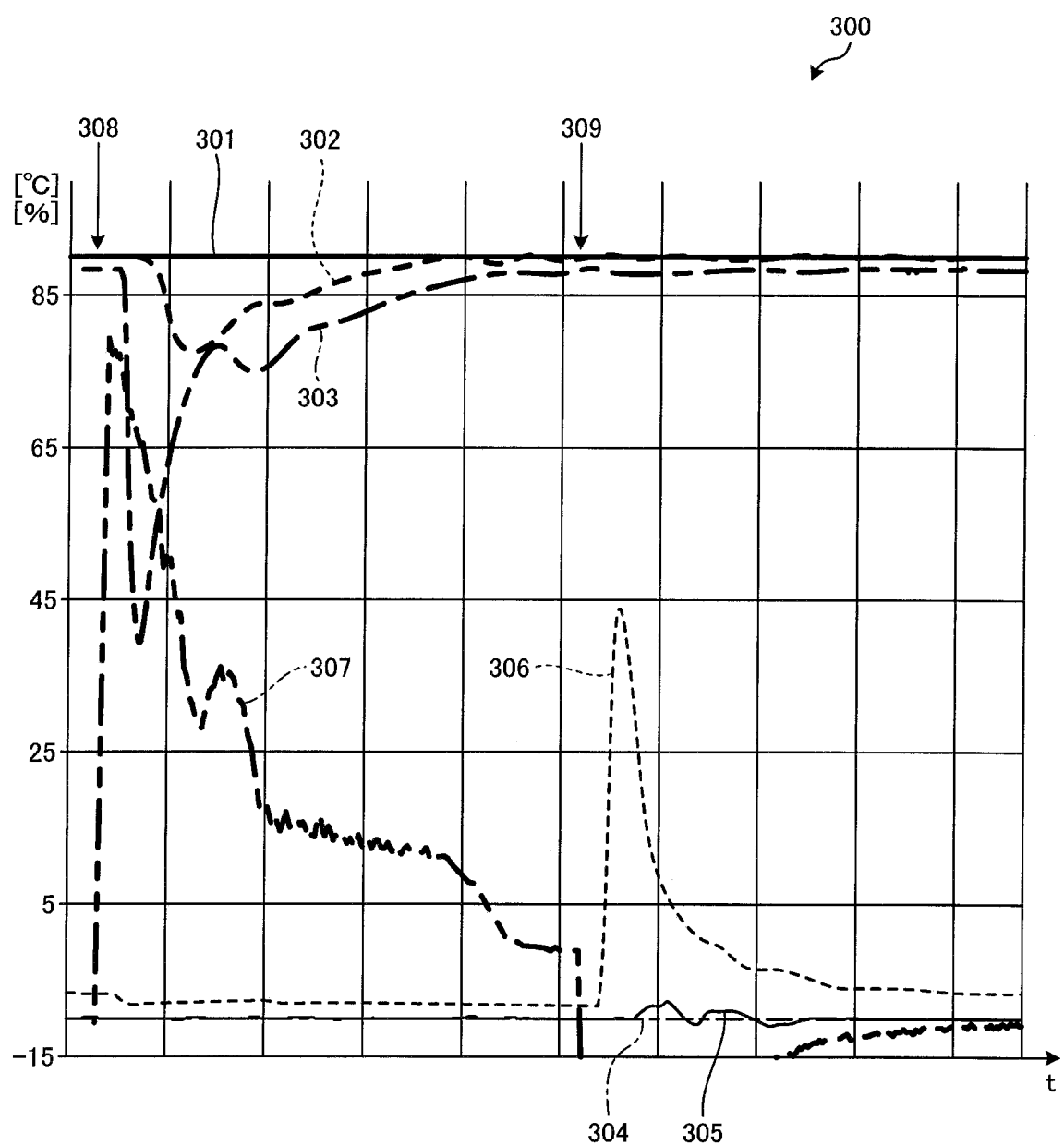
FIG. 4 shows an example of temperature characteristics in a test example.

Next, temperature characteristics in a test example related to the present embodiment and temperature characteristics in a comparative example in which the inverter frequencies of the pumps 222 and 242 are fixed will be described with reference to FIGS. 4 and 5. FIG. 4 shows an example of the temperature characteristics in the test example. In a graph 300 of FIG. 4, a graph 301 showing the set temperature of the first heat medium, a graph 302 of the temperature sensor 226 showing the heat medium temperature on the discharge side, and a graph 303 showing the heat medium temperature on the return side of the line are illustrated as graphs on the high temperature side. Further, in the graph 300, a graph 304 showing the set temperature of the second heat medium, a graph 305 of the temperature sensor 246 showing the heat medium temperature on the discharge, and a graph 306 showing the heat medium temperature on the return side of the line are illustrated as graphs on the low temperature side. Further, in the graph 300, a graph 307 shows the opening degree of the valve 201. The vertical axis of the graph 300 represents both a temperature and an opening degree.

In the graph 300, the temperature characteristics in an extreme example in which the set temperature of the control target is changed from a low temperature (10° C.) to a high temperature (70° C.) and then changed from the high temperature (70° C.) to the low temperature (10° C.) are illustrated. The first heat medium is set to 90° C. as shown in the graph 301, and the second heat medium is set to −10° C. as shown in the graph 304.

When the set temperature of the control target is changed from 10° C. to 70° C. at a timing 308, the opening degree of the valve 201 changes considerably to the plus side as shown in the graph 307 and, thus, the first heat medium flows into the flow path of the control target. As shown in the graph 302, the temperature of the first heat medium on the return side decreases to 39.2° C. immediately after the timing 308, but returns to a temperature slightly lower than 90° C. at a timing 309 when the first heat medium that has flowed into the flow path of the control target reaches the return side. Similarly, as shown in the graph 302, the temperature on the discharge side of the first heat medium decreases after the timing 308, but substantially returns to the set temperature of 90° C. at the timing 309.

Next, when the set temperature of the control target is changed from 70° C. to 10° C. at the timing 309, the opening degree of the valve 201 changes considerably to the minus side as shown in the graph 307 (partially omitted in FIG. 4), so that the second heat medium flows into the flow path of the control target. Further, as shown in the graph 306, the temperature of the second heat medium on the return side increases up to 44.0° C. immediately after the timing 309, but returns to about −5° C. at a timing corresponding to the right end of the graph 300 when the second heat medium that has flowed into the flow path of the control target reaches the return side. Similarly, as shown in the graph 305, the temperature on the discharge side of the second heat medium increases after the timing 309, but returns to the set temperature of −10° C. at the timing corresponding to the right end of the graph 300.

Figure 5:
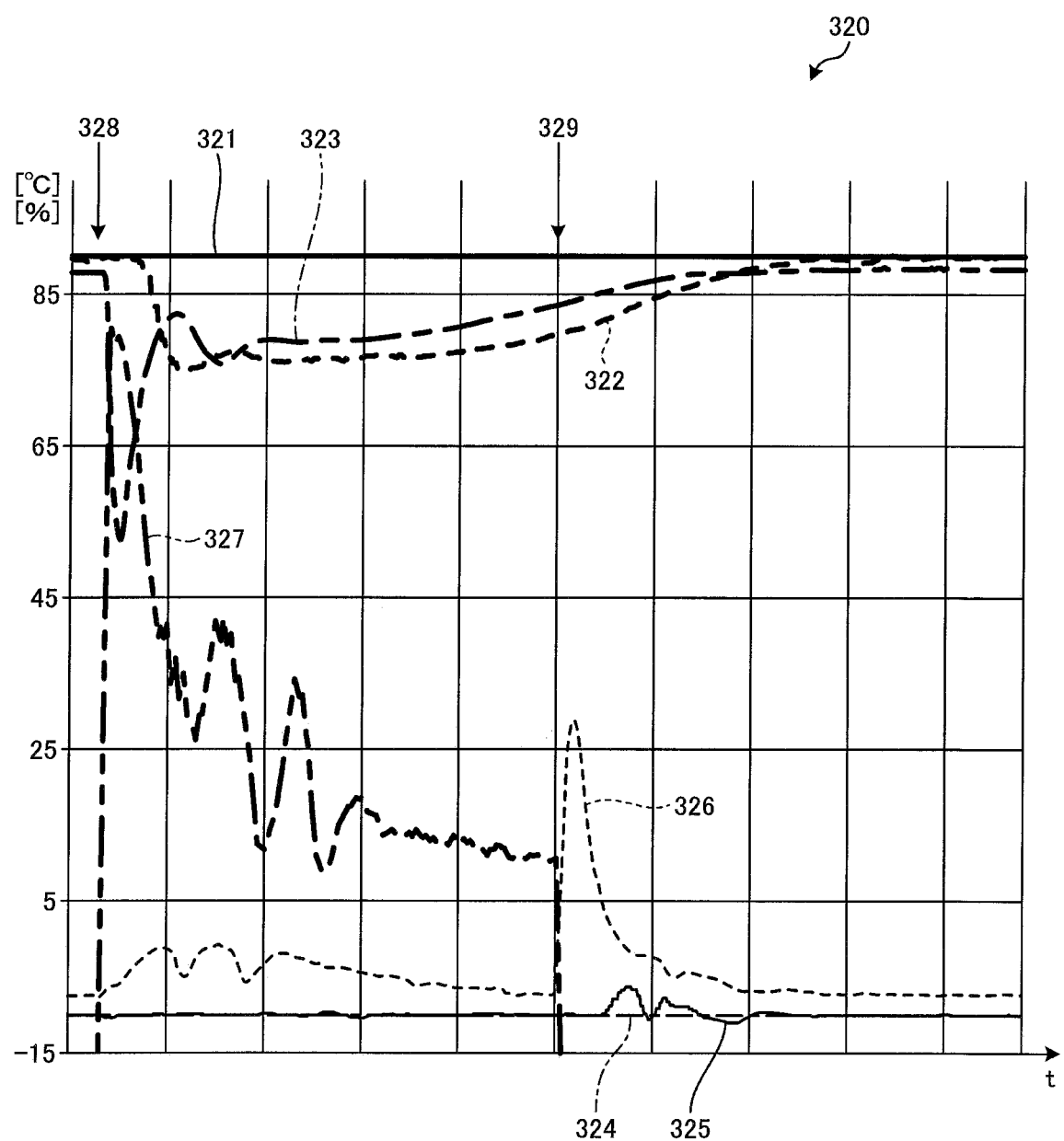
FIG. 5 shows an example of temperature characteristics in a comparative example.

FIG. 5 shows an example of temperature characteristics in the comparative example. In a graph 320 of FIG. 5, a graph 321 showing the set temperature of the first heat medium, a graph 322 showing the heat medium temperature on the discharge side, and a graph 323 showing the heat medium temperature on the return side of the line are illustrated as graphs on the high temperature side. Further, in the graph 320, a graph 324 showing the set temperature of the second heat medium, a graph 325 showing the heat medium temperature on the discharge side, and a graph 326 showing the heat medium temperature on the return side of the line are illustrated as graphs on the low temperature side. Further, in the graph 320, a graph 327 shows the opening degree of the valve 201. The vertical axis of the graph 320 represents both a temperature and an opening degree.

In the graph 320, similarly to the graph 300 of FIG. 4, the temperature characteristics in the case where the set temperature of the control target is changed from the low temperature (10° C.) to the high temperature (70° C.) and then changed from the high temperature (70° C.) to the low temperature (10° C.) are illustrated. The first heat medium is set to 90° C. as shown in the graph 321, and the second heat medium is set to −10° C. as shown in the graph 324.

When the set temperature of the control target is changed from 10° C. to 70° C. at a timing 328, the opening degree of the valve 201 changes considerably to the plus side as shown in the graph 327, so that the first heat medium flows into the flow path of the control target. Further, as shown in the graph 323, the temperature of the first heat medium on the return side decreases to 52.7° C. immediately after the timing 328, but returns to about 80° C. when the first heat medium that has flowed into the flow path of the control target reaches the return side. However, even at the timing 329, the temperature is slightly lower than 85° C. without returning to the set temperature of 90° C. Similarly, as shown in the graph 322, the temperature on the discharge side of the first heat medium decreases after the timing 328 and reaches about 80° C. without returning to the set temperature of 90° C. even at the timing 329. On the other hand, as shown in the graph 326, the temperature of the second heat medium on the return side increases to about 0° C. immediately after the timing 328, so that it is considered that the check valve 205 on the second heat medium side and the check valve 204 on the first heat medium side are opened simultaneously. It is considered that this is because the temperature on the return side and the temperature on the discharge side of the first heat medium did not return to the level close to the set temperature even at the timing 329.

Next, when the set temperature of the control target is changed from 70° C. to 10° C. at the timing 329, as shown in the graph 327, the opening degree of the valve 201 changes considerably to the minus side (partially omitted in FIG. 5), so that the second heat medium flows into the flow path of the control target. Further, as shown in the graph 326, the temperature of the second heat medium on the return side increases to about 28.9° C. immediately after the timing 329, but returns to about −5° C. at the timing corresponding to the right end of the graph 320 when the second heat medium that has flow into the flow path of the control target reaches the return side. Similarly, as shown in the graph 325, the temperature on the discharge side of the second heat medium increases after the timing 329, but returns to the set temperature of −10° C. at the timing corresponding to the right end of the graph 300.

According to the test results of the graphs 300 and 320, in the comparative example, when the temperature is changed from low temperature to high temperature, the temperature of the second heat medium on the return side is maintained at a high level, so that the check valve 205 is opened. On the other hand, in the test example, the temperature of the second heat medium on the return side hardly changes, so that the check valve 205 is closed. In other words, it is clear that the temperature controllability is improved in the test example than in the comparative examples.

First Modified Example

In the above embodiment, the temperature controller 20 of the type in which the heat medium circulates in the circulator 200 has been described. However, it is also possible to use a temperature controller of a type in which the heat medium flowing through the flow path 15 in the lower electrode LE is switched between the first heat medium and the second heat medium. Such an embodiment will be described as a first modified example. Since the partial configuration of the substrate processing apparatus and the temperature controller and the pressure control method in the first modified example are the same as those in the above-described embodiment, redundant description thereof will be omitted.

Figure 6:
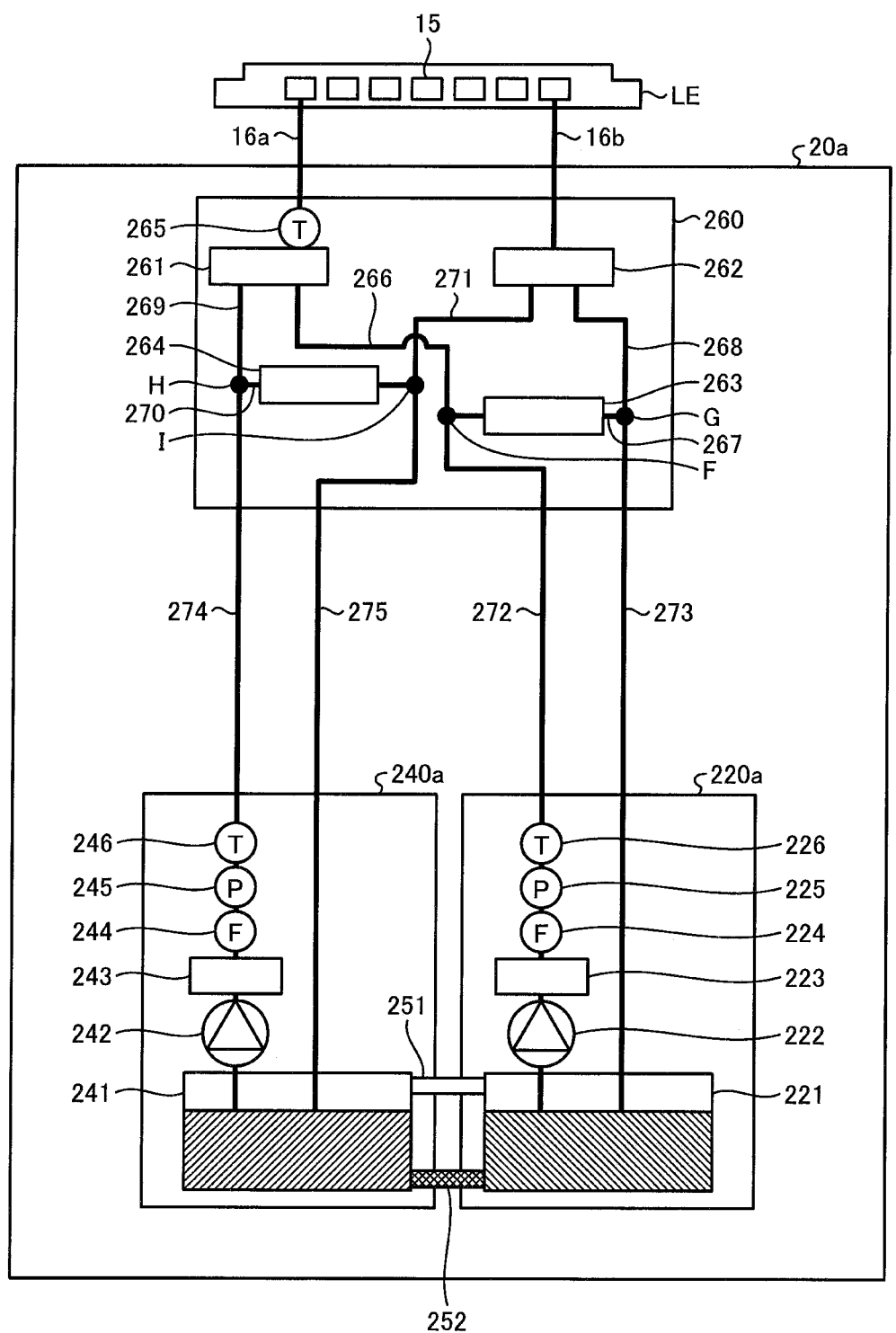
FIG. 6 shows an example of a temperature controller in a first modified example.

FIG. 6 shows an example of the temperature controller in the first modified example. A temperature controller 20a shown in FIG. 6 is different from the temperature controller 20 in the above embodiment in that it includes a switching device 260, a first temperature controller 220a, and a second temperature controller 240a, instead of the circulator 200, the first temperature controller 220, and the second temperature controller 240. The switching device 260 has valves 261 to 264, temperature sensors 265, and lines 266 to 271.

The first temperature controller 220a is connected to the line 16a through a line 272, the line 266, and the valve 261. Further, the first temperature controller 220a is connected to the line 16b through a line 273, the line 268, and the valve 262. In the first modified example, the first temperature controller 220a controls the temperature of the first heat medium on the high temperature side. The first temperature controller 220a supplies the temperature-controlled first heat medium into the flow path 15 of the lower electrode LE through the line 272, the line 266, the valve 261, and the line 16a. The heat medium supplied into the flow path 15 of the lower electrode LE is returned to the first temperature controller 220a through the line 16b, the valve 262, the line 268, and the line 273. The line including the lines 272 and 266 and the line 16a is an example of the supply line or the first supply line. Further, the line including the lines 16b, 268, and 273 is an example of the return line or the first return line.

The second temperature controller 240a is connected to the line 16a through a line 274, the line 269, and the valve 261. Further, the second temperature controller 240a is connected to the line 16b through a line 275, the line 271, and the valve 262. In the first modified example, the second temperature controller 240a controls the temperature of the second heat medium on the low temperature side. The second temperature controller 240a supplies the temperature-controlled second heat medium into the flow path 15 of the lower electrode LE through the line 274, the line 269, the valve 261, and the line 16a. The heat medium supplied into the flow path 15 of the lower electrode LE is returned to the second temperature controller 240a through the line 16b, the valve 262, the line 271, and the line 275. The line including the line 274, the line 269, and the line 16a is an example of the supply line or the second supply line. Further, the line including the line 16b, the line 271, and the line 275 is an example of the return line or the second return line.

The valve 261 is disposed at the connection portion of the line 16a, the line 266, and the line 269, and switches the heat medium flowing in the flow path 15 of the lower electrode LE to the first heat medium or the second heat medium. The valve 262 is disposed at the connection portion of the line 16b, the line 268, and the line 271, and switches an output destination of the heat medium discharged from the flow path 15 of the lower electrode LE to the first temperature controller 220a or the second the temperature controller 240a.

A connection position F between the line 272 and the line 266 and a connection position G between the line 273 and the line 268 are connected by the line 267 that is a bypass line. The line 267 is provided with a bypass valve 263.

A connection position H between the line 274 and the line 269 and a connection position I between the line 275 and the line 271 are connected by the line 270 that is a bypass line. The line 270 is provided with a bypass valve 264.

The line 16a in the temperature controller 20a is provided with the temperature sensor 265 for measuring the temperature on the inlet side of the flow path 15. The temperature sensor 265 may be disposed outside the temperature controller 20a. For example, the temperature sensor 265 may be disposed directly under the lower electrode LE, e.g., at the connection portion of the line 16a and the flow path 15, or may be disposed at an intermediate portion between the lower electrode LE and the temperature controller 20a.

The opening and closing of the valves 261 and 262 and the bypass valves 263 and 264 are controlled by the controller 11. The first temperature controller 220a and the second temperature controller 240a are the same as the first temperature controller 220 and the second temperature controller 240 related to the above embodiment except that the variable valves 227 and 228, and the variable valves 247 and 248 are omitted, so that the description thereof will be omitted.

In the temperature controller 20a, when the first heat medium on the high temperature side is supplied into the flow path 15 of the lower electrode LE, the valve 261 is opened on the line 266 side and closed on the line 269 side, and the valve 262 is opened on the line 268 side and closed on the line 271 side. The bypass valve 263 is closed and the bypass valve 264 is opened. Therefore, the first heat medium on the high temperature side supplied from the first temperature controller 220a is supplied into the flow path 15 of the lower electrode LE and returned to the first temperature controller 220a, and the second heat medium on the low temperature side supplied from the second temperature controller 240 is returned to the second temperature controller 240a through the bypass valve 264.

On the other hand, in the temperature controller 20a, when the second heat medium on the low temperature side is supplied into the flow path 15 of the lower electrode LE, the valve 261 is closed on the line 266 side and opened on the line 269 side, and the valve 262 is closed on the line 268 side and opened on the line 271 side. The bypass valve 263 is opened and the bypass valve 264 is closed. Therefore, the second heat medium on the low temperature side supplied from the second temperature controller 240a is supplied into the flow path 15 of the lower electrode LE and returned to the second temperature controller 240a, and the first heat medium on the high temperature side supplied from the first temperature controller 220a is returned to the first temperature controller 220a through the bypass valve 263.

(Pressure Control Method)

The controller 11 performs a pressure control process in the temperature controller 20a in the same manner as that shown in FIG. 3 of the above embodiment. In other words, the controller 11 controls the pressure sensors 225 and 245 to detect the pressures in the lines 272 and 274, respectively (step S1). The controller 11 compares the detected pressures in the lines 272 and 274 with the set values (step S2). The controller 11 controls the inverter frequencies of the pumps 222 and 242 such that the pressures in the lines 272 and 274 become close to the set values based on the comparison result (step S3). In other words, the controller 11 controls the discharge pressures of the pumps 222 and 242 based on the difference between the pressures detected by the pressure sensors 225 and 245 and the set values of the discharge pressures of the pumps 222 and 242. Since the variation in the pressures in the lines 272 and 274 for supplying the heat medium is suppressed, the temperature controllability for the control target (the lower electrode LE) can be improved.

Second Modified Example

In the above embodiment and first modified example, the temperature controllers 20 and 20a for supplying a heat medium to one control target have been described. However, the present disclosure may be applied to a temperature controller for controlling a temperature of an upper system such as the upper electrode disposed at an upper portion of the processing chamber or the like. Such an embodiment will be described as a second modified example. Since the partial configuration of the substrate processing apparatus and the temperature controller and the pressure control method in the second modified example are the same as those in the above embodiment and first modified example, redundant description thereof will be omitted.

Figure 7:
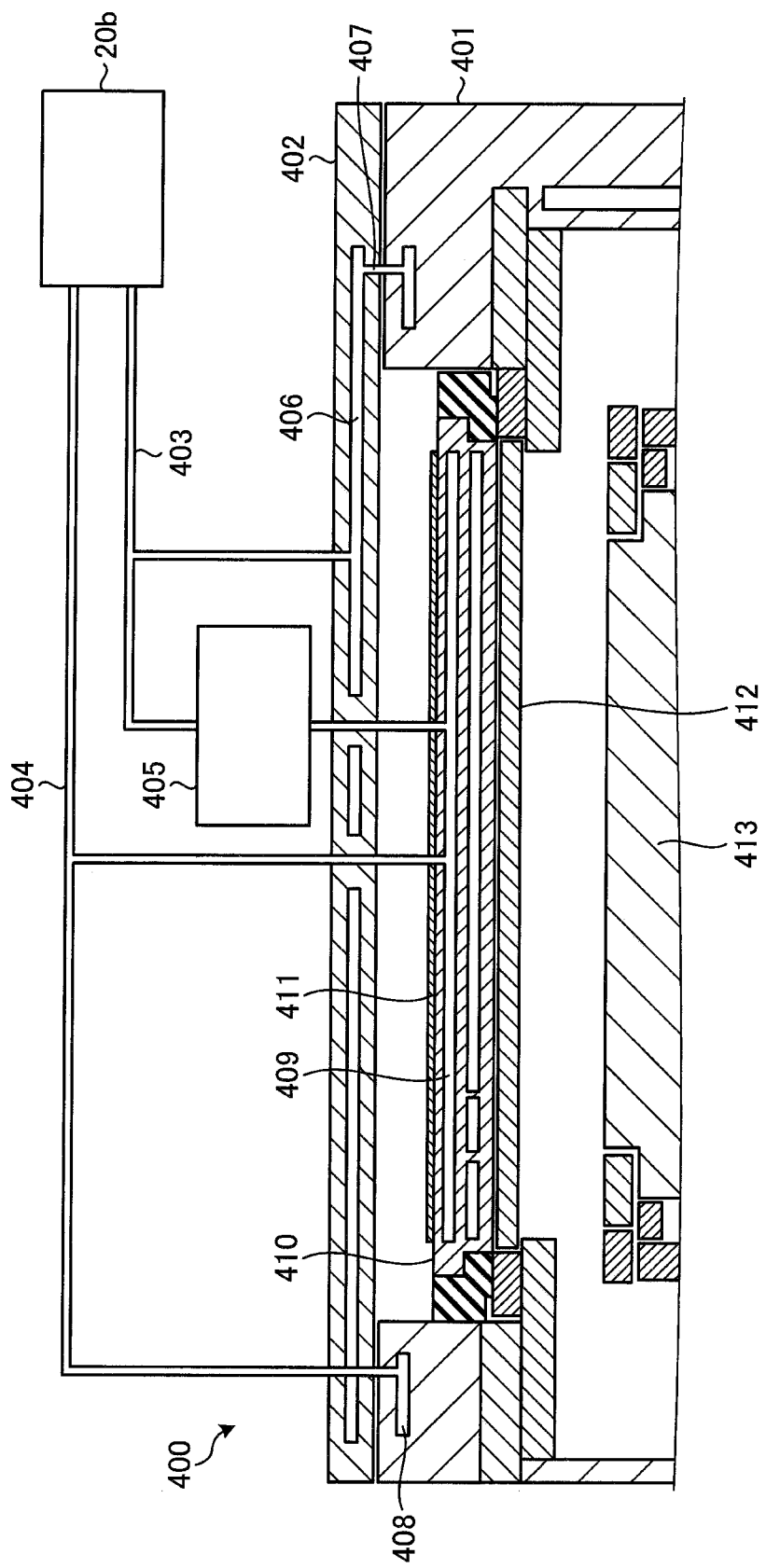
FIG. 7 shows an example of a control target in a second modified example.

FIG. 7 shows an example of a control target in the second modified example. A substrate processing apparatus 400 shown in FIG. 7 is an example of a substrate processing apparatus having an upper electrode provided with a cooling plate 410 as a control target at an upper portion of a processing chamber 401. In the substrate processing apparatus 400, the cooling plate 410 is supported at the upper portion of the processing chamber 401 via a support member. The cooling plate 410 has a heater 411 and an electrode plate 412. The electrode plate 412 that is an example of the upper electrode has a bottom surface facing the processing space and faces an upper surface of a substrate support 413 having a lower electrode. A ceiling plate 402 is supported by the processing chamber 401 at a position above the cooling plate 410. In FIG. 7, a system for supplying a processing gas supply and a system for supplying an RF power to the upper electrode are omitted.

The cooling plate 410 has therein a flow path 409 through which a heat medium flows. A flow path 408 through which a heat medium flows is formed at an upper portion of the processing chamber 401. Similarly, the ceiling plate 402 has therein a flow path 406 through which a heat medium flows. The flow paths 406 and 408 are connected by a flow path 407. In other words, the flow paths 406 to 408 for controlling the temperatures of the processing chamber 401 and the ceiling plate 402, and flow paths 409 for controlling the temperature of the cooling plate 410 are formed at the upper portion of the processing chamber 401. The cooling plate 410 is cooled by increasing the flow rate of the heat medium of, e.g., 35° C., when heat is inputted from the plasma, and is adjusted to, e.g., 150° C., by decreasing the flow rate of the heat medium and performing heating using the heater 411 in an idle state.

A temperature controller 20b supplies a heat medium from a line 403 connected to the flow path 406 into the flow paths 406 to 408. The heat medium supplied into the flow paths 406 to 408 is returned to the temperature controller 20b through a line 404 connected to the flow path 408. Further, the temperature controller 20b supplies the heat medium into the flow path 409 through the line 403 and a flow rate control valve 405. The heat medium supplied into the flow path 409 is returned to the temperature controller 20b through the line 404 connected to the flow path 409.

Figure 8:
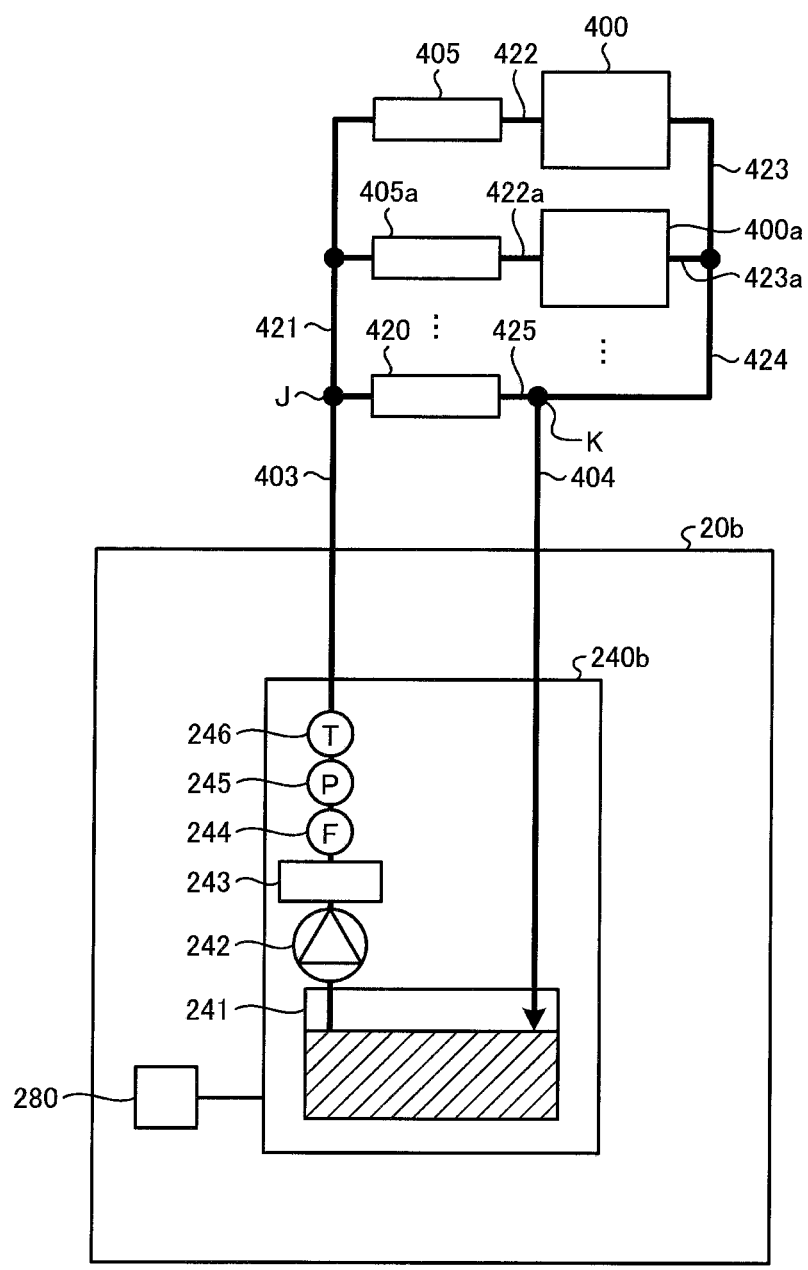
FIG. 8 shows an example of a temperature controller in the second modified example.

FIG. 8 shows an example of the temperature controller in the second modified example. The temperature controller 20b shown in FIG. 8 is different from the temperature controller 20 in the above embodiment in that it does not have the circulator 200 and has a controller 240b instead of the first temperature controller 220 and the second temperature controller 240. In other words, the temperature controller 20b has the temperature controller 240b for supplying a heat medium controlled to one set temperature, instead of multiple temperature controllers on a high temperature side and a low temperature side. In FIG. 8, the path for supplying the heat medium into the flow paths 406 to 408 is omitted. Further, the temperature controller 20b has therein a controller 280. The controller 280 controls individual components in the temperature controller 20b based on the information from the substrate processing apparatus 400.

The temperature controller 240b is connected to a plurality of substrate processing apparatuses 400 through the lines 403 and 404. In FIG. 8, two substrate processing apparatuses 400 and 400a are illustrated, and flow rate control valves 405 and 405a corresponding to the substrate processing apparatuses 400 and 400a are illustrated. In FIG. 8, the line 403 is branched into lines 422 and 422a corresponding to the substrate processing apparatuses 400 and 400a. Further, lines 423 and 423a corresponding to the substrate processing apparatuses 400 and 400a are joined to the line 404.

The temperature controller 240b is connected to the substrate processing apparatus 400 through the line 403, the line 421, the flow rate control valve 405, and the line 422. Further, the temperature controller 240b is connected to the substrate processing apparatus 400 through the line 404, the line 424, and the line 423. In the second modified example, the temperature controller 240b controls the temperature of the heat medium set to the set temperature (e.g., 35° C.). When the flow rate control valve 405 is opened, the temperature controller 240b supplies the temperature-controlled heat medium into the flow path 409 of the substrate processing apparatus 400 through the line 403, the line 421, the flow rate control valve 405, and the line 422. The heat medium supplied into the flow path 409 is returned to the temperature controller 240b through the line 423, the line 424, and the line 404. The line including the line 403, the line 421, and the line 422 is an example of the supply line. The line including of the line 423, the line 424, and the line 404 is an example of the return line.

Similarly, the temperature controller 240b is connected to the substrate processing apparatus 400a through the line 403, the line 421, the flow rate control valve 405a, and the line 422a. Further, the temperature controller 240b is connected to the substrate processing apparatus 400a through the line 404, the line 424, and the line 423a. When the flow rate control valve 405a is opened, the temperature controller 240b supplies the temperature-controlled heat medium into the flow path 409 of the substrate processing apparatus 400a through the line 403, the line 421, the flow rate control valve 405a, and the line 422a. The heat medium supplied into the flow path 409 is returned to the temperature controller 240b through the line 423a, the line 424, and the line 404.

A connection position J between the line 403 and the line 421 and a connection position K between the line 404 and the line 424 are connected by a line 425 that is a bypass line. The line 425 is provided with a bypass valve 420. The bypass valve 420 is opened when both the flow control valves 405 and 405a at the downstream side are closed, so that the heat medium flowing in the flow path 409 is returned from the line 403 to the line 404.

The opening and closing of the flow rate control valves 405 and 405a and the bypass valve 420 are controlled by the controller 280. Since the temperature controller 240b is the same as the second temperature controller 240 related to the above embodiment except that the variable valves 247 and 248 are omitted, the description thereof will be omitted.

Since the flow rate control valves 405 and 405a are opened and closed depending on the temperature control in the substrate processing apparatuses 400 and 400a, the pressure in the line 403 on the discharge side of the heat medium varies depending on the opening and closing of the flow rate control valves 405 and 405a.

(Pressure Control Method)

The controller 280 performs the pressure control process in the same manner as that shown in FIG. 3 of the above embodiment. In other words, the controller 280 controls the pressure sensor 245 to detect the pressure in the line 403 (step S1). The controller 280 compares the detected pressure in the line 403 with the set value (step S2). The controller 280 controls the inverter frequency of the pump 242 such that the pressure in the line 403 becomes close to the set value based on the comparison result (step S3). In other words, the controller 280 controls the discharge pressure of the pump 242 based on the difference between the pressure detected by the pressure sensor 245 and the set value of the discharge pressure of the pump 242. Since the variation of the pressure in the line for supplying the heat medium is suppressed, the temperature controllability for the control target (the cooling plate 410) can be improved.

As described above, in accordance with the present embodiment and the modified examples, the temperature controllers 20, 20a, and 20b includes the supply lines (the lines 229, 249, 272, 274, and 403) for supplying the heat medium to the control target (the lower electrode LE and the cooling plate 410), the return lines (the lines 230, 250, 273, 275, and 404) for returning the heat medium from the control target, the pumps 222 and 242 for discharging the heat medium to the supply lines, the pressure sensors 225 and 245 for detecting the pressures in the supply lines immediately after the pumps, and the controller 280. The controller controls the discharge pressures of the pumps based on the difference between the pressures detected by the pressure sensors and the set values of the discharge pressures of the pumps. Accordingly, the temperature controllability for the control target can be improved. The feedback control may be performed based on the pressures detected by the pressure sensors 208 and 209 instead of the pressures detected by the pressure sensors 225 and 245. Further, the feedback control may be performed based on the pressures detected by the pressure sensors additionally disposed at the supply lines (the lines 229, 249, 272, 274, and 403) for supplying the heat medium.

Further, in accordance with the present embodiment and the modified examples, the discharge pressure is controlled by controlling the inverter frequency of the pump. Accordingly, it is possible to suppress variation of the pressure in the line for supplying the heat medium.

Further, in accordance with the second modified example, the number of control targets is two or more. Accordingly, even when the pressure in the line for supplying the heat medium varies depending on the operations of the multiple control targets, it is possible to suppress the variation of the pressure in the line for supplying the heat medium.

Further, in accordance with the present embodiment, the substrate processing apparatus 1 includes the substrate support PD disposed in the processing chamber 12 to place the substrate (wafer W) thereon, the first temperature controller 220 configured to supply the heat medium having the first temperature to the flow path 15 disposed in the substrate support PD through the first line (the lines 229, 210, and 16a), the second temperature controller 240 configured to supply the heat medium having the second temperature to the flow path 15 through the second line (the lines 249, 213, and 16a), the third line (the lines 16b, 207, and 16a) configured to circulate the heat medium while being connected from the outlet of the flow path 15 to the inlet of the flow path 15, a check valve mechanism connected to the outlet of the flow path 15 and configured to branch the heat medium in three directions, the check valve mechanism including the first check valve 204 connected to the first line, the second check valve 205 connected to the second line, and the third check valve 206 that is connected to the third line and opened when the heat medium circulates, and the control device (the controller 11). The controller detects the pressures in the first line and the second line. Further, the controller compares the detected pressure in the first line with the first set value of the pressure in the first line, and compares the detected pressure in the second line with the second set value of the pressure in the second line. Moreover, when the first check valve is opened due to the pressure difference between the outlet side of the flow path 15 and the first line, the controller controls the first temperature controller 220 such that the pressure in the first line becomes close to the first set value of the pressure in the first line based on the comparison result. When the second check valve is opened due to the pressure difference between the outlet side of the flow path 15 and the second line, the controller controls the second temperature controller 240 such that the pressure in the second line becomes close to the second set value based on the comparison result. Accordingly, the temperature controllability for the control target (the lower electrode LE) can be improved by controlling the pressures on the discharge sides of the pumps 222 and 242) to be constant.

Further, in accordance with the present embodiment, the valve 201 for controlling a mixing ratio of the heat media flowing through the first line, the second line, and the third line, and the temperature sensor 203 for detecting the temperature of the mixed heat medium are disposed on the inlet side of the flow path 15. The opening degree of the valve 201 is controlled such that the heat medium flowing through the first line or the second line are mixed with the heat medium flowing through the third line depending on the temperature detected by the temperature sensor 203. Accordingly, the temperature controllability for the control target (the lower electrode LE) can be improved.

Further, in accordance with the present embodiment, the pressure in the first line is detected by the first pressure sensor (the pressure sensor 225) disposed immediately after the pump 222 of the first temperature controller 220, and the pressure in the second line is detected by the second pressure sensor (the pressure sensor 245) disposed immediately after the pump 242 of the second temperature controller 240. Accordingly, the pressures of the lines immediately after the pumps can be feedback-controlled by the inverter frequencies of the pumps.

Further, in accordance with the present embodiment, the discharge pressures of the pumps are controlled by controlling the inverter frequencies of the pumps 222 and 242. Accordingly, the discharge pressures of the pumps can be stabilized.

The embodiments of the present disclosure are illustrative in all respects and are not restrictive. The above-described embodiments may be omitted, replaced, or changed in various forms without departing from the scope of the appended claims and the gist thereof.

Although capacitively coupled plasma (CCP) is used as an example of a plasma source in the above embodiment, the present disclosure is not limited thereto. The plasma source may be, e.g., inductively coupled plasma (ICP), microwave excited surface wave plasma (SWP), electron cyclotron resonance plasma (ECP), helicon wave plasma (HWP), or the like.

Although the plasma etching processing apparatus has been described as an example of the substrate processing apparatus 1 in the above embodiment, the present disclosure is not limited thereto. The present disclosure may be applied to a film forming apparatus, a modifying apparatus, a cleaning device, or the like, other than an etching apparatus, as long as the apparatus controls a temperature of a temperature control target such as the wafer W or the like using a temperature-controlled heat medium.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A temperature controller comprising:
a supply line configured to supply a heat medium to at least one control target;
a return line configured to return the heat medium from control target;
a first pump configured to discharge the heat medium to the supply line;
a first pressure sensor configured to detect a first pressure in the supply line disposed immediately after the first pump;
a second pump configured to discharge the heat medium to the supply line;
a second pressure sensor configured to detect a second pressure in the supply line disposed immediately after the second pump;
a temperature sensor configured to detect a temperature in the supply line;
a valve configured to control a mixing ratio of the heat medium discharged by the first pump and the heat medium discharged by the second pump; and
a controller,
wherein the controller is configured to:
when the temperature detected in the supply line is lower than a set temperature, control a discharge pressure of the first pump based upon a difference between the first pressure detected by the first pressure sensor and a first set value of the discharge pressure of the first pump,
when the temperature detected in the supply line reaches the set temperature control an opening degree of the valve configured to reduce a contribution of the heat medium supplied by the first pump, and
when the temperature detected in the supply line is higher than the set temperature, control a discharge pressure of the second pump based upon a difference between the second pressure detected by the second pressure sensor and a second set value of the second pump.

2. The temperature controller of claim 1, wherein the controller is configured to:
control the discharge pressure of the first pump by controlling an inverter frequency of the first pump, and
control the discharge pressure of the second pump by controlling an inverter frequency of the second pump.

3. The temperature controller of claim 1, wherein the number of the control target is two or more.

4. The temperature controller of claim 2, wherein the number of the control target is two or more.

5. The temperature controller of claim 1, wherein the controller is configured to, when the temperature detected in the supply line is lower than the set temperature, increase the discharge pressure of the first pump such that the first pressure detected by the first pressure sensor comes close to the first set value.

6. The temperature controller of claim 1, wherein the controller is configured to, when the temperature detected in the supply line is higher than the set temperature, increase the discharge pressure of the second pump such that the second pressure detected by the second pressure sensor comes close to the second set value.

7. The temperature controller of claim 5, wherein the controller is configured to, when the temperature detected in the supply line is higher than the set temperature, increase the discharge pressure of the second pump such that the second pressure detected by the second pressure sensor comes close to the second set value.

8. The temperature controller of claim 1, wherein the controller is configured to, when the temperature detected in the supply line is lower than the set temperature, control the opening degree of the valve to increase the contribution of the heat medium supplied by the first pump.

9. The temperature controller of claim 1, wherein the controller is configured to, when the temperature detected in the supply line is higher than the set temperature, control the opening degree of the valve to increase the contribution of the heat medium supplied by the second pump.

10. The temperature controller of claim 8, wherein the controller is configured to, when the temperature detected in the supply line is higher than the set temperature, control the opening degree of the valve to increase the contribution of the heat medium supplied by the second pump.

11. The temperature controller of claim 1, wherein the controller is configured to, when the temperature detected in the supply line is lower than the set temperature:
control the opening degree of the valve to increase the contribution of the heat medium supplied by the first pump, and
increase the discharge pressure of the first pump such that the first pressure detected by the first pressure sensor comes close to the first set value.

12. The temperature controller of claim 1, wherein the controller is configured to, when the temperature detected in the supply line is higher than the set temperature:
control the opening degree of the valve to increase the contribution of the heat medium supplied by the second pump, and
increase the discharge pressure of the second pump such that the second pressure detected by the second pressure sensor comes close to the second set value.

13. The temperature controller of claim 11, wherein the controller is configured to, when the temperature detected in the supply line is higher than the set temperature:
control the opening degree of the valve to increase the contribution of the heat medium supplied by the second pump, and increase the discharge pressure of the second pump such that the second pressure detected by the second pressure sensor comes close to the second set value.

* * * * *